United States Patent
Tanaka et al.

(10) Patent No.: US 11,795,546 B2
(45) Date of Patent: Oct. 24, 2023

(54) SUBSTRATE LIQUID PROCESSING APPARATUS, SUBSTRATE LIQUID PROCESSING METHOD AND RECORDING MEDIUM

(71) Applicant: Tokyo Electron Limited, Tokyo (JP)

(72) Inventors: Takashi Tanaka, Kumamoto (JP); Keiichi Fujita, Kumamoto (JP); Yuichiro Inatomi, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 431 days.

(21) Appl. No.: 16/767,278

(22) PCT Filed: Nov. 22, 2018

(86) PCT No.: PCT/JP2018/043097
§ 371 (c)(1),
(2) Date: May 27, 2020

(87) PCT Pub. No.: WO2019/107258
PCT Pub. Date: Jun. 6, 2019

(65) Prior Publication Data
US 2021/0002770 A1 Jan. 7, 2021

(30) Foreign Application Priority Data
Nov. 28, 2017 (JP) ................................. 2017-228073

(51) Int. Cl.
*C23C 18/18* (2006.01)
*C23C 18/16* (2006.01)
(Continued)

(52) U.S. Cl.
CPC ...... *C23C 18/1803* (2013.01); *C23C 18/1632* (2013.01); *C23G 1/02* (2013.01); *C23G 3/00* (2013.01); *H01L 21/02057* (2013.01)

(58) Field of Classification Search
None
See application file for complete search history.

(56) References Cited

U.S. PATENT DOCUMENTS

2005/0181226 A1\* 8/2005 Weidman .......... H01L 21/76849
257/E21.174
2005/0245080 A1\* 11/2005 Wang ................ H01L 21/02074
438/626
(Continued)

FOREIGN PATENT DOCUMENTS

JP  2007-274003 A  10/2007
JP  2013-010995 A  1/2013
(Continued)

OTHER PUBLICATIONS

International Search Report for PCT/JP2018/043097 dated Dec. 25, 2018.

*Primary Examiner* — Mikhail Kornakov
*Assistant Examiner* — Pradhuman Parihar
(74) *Attorney, Agent, or Firm* — Pearne & Gordon LLP

(57) ABSTRACT

A substrate processing apparatus includes a substrate holder configured to horizontally hold and rotate a substrate which has a recess and a base metal layer exposed from a bottom surface of the recess; and a pre-cleaning liquid supply configured to supply a pre-cleaning liquid such as dicarboxylic acid or tricarboxylic acid onto the substrate being held and rotated by the substrate holder, to thereby pre-clean the base metal layer. A temperature of the pre-cleaning liquid on the substrate is equal to or higher than 40° C.

7 Claims, 9 Drawing Sheets

(51) Int. Cl.
  *C23G 1/02*  (2006.01)
  *C23G 3/00*  (2006.01)
  *H01L 21/02* (2006.01)

(56) References Cited

U.S. PATENT DOCUMENTS

2008/0226826 A1   9/2008  Tanaka et al.
2008/0226836 A1*  9/2008  Nolas ..................... B22F 9/004
                                                  423/276

FOREIGN PATENT DOCUMENTS

| JP | 2013-010996 A | 1/2013 |
| JP | 2015-178661 A | 10/2015 |
| JP | 2016-056407 A | 4/2016 |
| JP | 2016-536453 A | 11/2016 |
| WO | 2008/001698 A1 | 1/2008 |
| WO | 2015/058999 A1 | 4/2015 |

* cited by examiner

SUBSTRATE LIQUID PROCESSING APPARATUS, SUBSTRATE LIQUID PROCESSING METHOD AND RECORDING MEDIUM

CROSS-REFERENCE TO RELATED APPLICATION

This Application is a U.S. national phase application under 35 U.S.C. § 371 of PCT Application No. PCT/JP2018/043097 filed on Nov. 22, 2018, which claims the benefit of Japanese Patent Application No. 2017-228073 filed on Nov. 28, 2017, the entire disclosures of which are incorporated herein by reference.

TECHNICAL FIELD

The various aspects and embodiments described herein pertain generally to a substrate liquid processing apparatus, a substrate liquid processing method and a recording medium.

BACKGROUND

In general, there is known a substrate liquid processing apparatus configured to perform an electroless plating processing on a substrate (wafer) by using a processing liquid composed of a plating liquid. In this substrate liquid processing apparatus, a pre-cleaning processing for the substrate may be performed before the substrate is subjected to the plating processing. To be specific, a base metal layer such as copper existing on the substrate is subjected to the pre-cleaning processing (pre-cleaned) by an acidic organic liquid before the plating liquid is supplied, so that an oxide film of the copper or the like formed on the base metal layer is removed.

PRIOR ART DOCUMENT

Patent Document 1: Japanese Patent Laid-open Publication No. 2013-010996

DISCLOSURE OF THE INVENTION

Problems to be Solved by the Invention

Means for Solving the Problems

In one exemplary embodiment, a substrate liquid processing apparatus includes a substrate holder configured to horizontally hold and rotate a substrate which has a recess and a base metal layer exposed from a bottom surface of the recess; and a pre-cleaning liquid supply configured to supply a pre-cleaning liquid such as dicarboxylic acid or tricarboxylic acid onto the substrate being held and rotated by the substrate holder, to thereby pre-clean the base metal layer. A temperature of the pre-cleaning liquid on the substrate is equal to or higher than 40° C.

In another exemplary embodiment, a substrate liquid processing method includes horizontally holding and rotating a substrate which has a recess and a base metal layer exposed from a bottom surface of the recess; and pre-cleaning the base metal layer by supplying a pre-cleaning liquid such as dicarboxylic acid or tricarboxylic acid onto the substrate being rotated. A temperature of the pre-cleaning liquid on the substrate is equal to or higher than 40° C.

In still another exemplary embodiment, there is provided a computer-readable recording medium having stored thereon computer-executable instructions that, in response to execution, cause a substrate liquid processing apparatus to perform a substrate liquid processing method.

Effect of the Invention

According to the exemplary embodiment, it is possible to carry out a pre-cleaning processing in a short time period by improving processing performance of a pre-cleaning process.

DETAILED DESCRIPTION

Hereinafter, exemplary embodiments of the present disclosure will be described with reference to accompanying drawings which form a part thereof.

Figure 1:
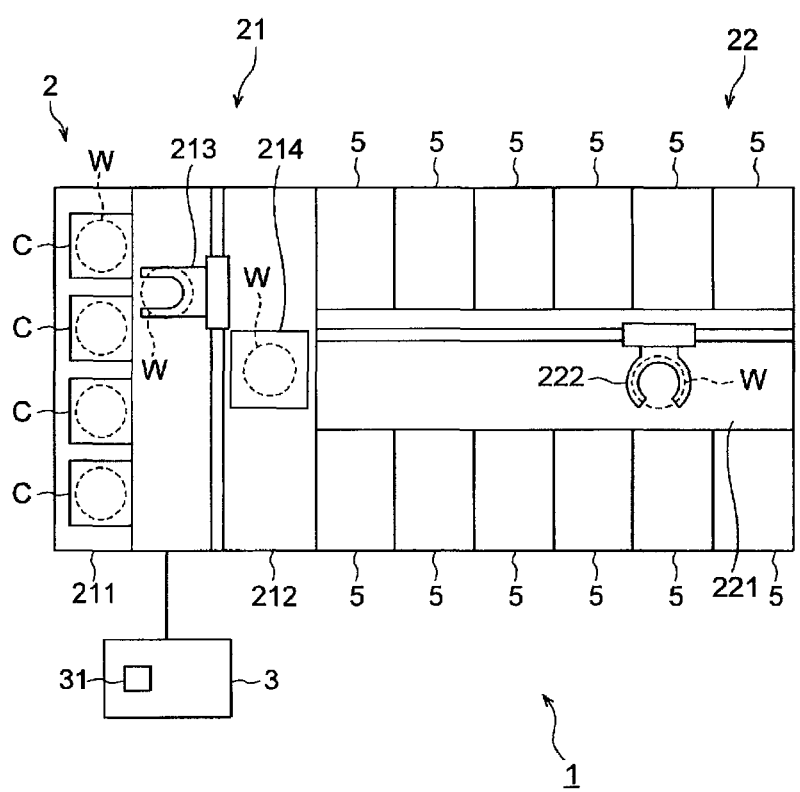
FIG. 1 is a schematic plan view illustrating a configuration of a plating apparatus.

First, referring to FIG. 1, a configuration of a substrate liquid processing apparatus according to an exemplary embodiment will be explained. FIG. 1 is a schematic diagram illustrating a configuration of a plating apparatus as an example of the substrate liquid processing apparatus according to the exemplary embodiment. Here, the plating apparatus is an apparatus configured to perform a plating processing (a liquid processing) on a substrate W by supplying a plating liquid L1 (processing liquid) onto the substrate W.

As depicted in FIG. 1, a plating apparatus 1 according to the present exemplary embodiment is equipped with a plating unit 2 and a controller 3 configured to control an operation of the plating unit 2.

The plating unit 2 is configured to perform various processings on the substrate W (wafer). The various processings performed by the plating unit 2 will be described later.

The controller 3 is implemented by, for example, a computer, and includes an operation controller and a storage. The operation controller is implemented by, by way of example, a CPU (Central Processing Unit) and is configured to control an operation of the plating unit 2 by reading and executing programs stored in the storage. The storage may be implemented by a memory device such as, but not limited to, a RAM (Random Access Memory), a ROM (Read Only Memory), or a hard disk, and stores therein programs for controlling the various processings performed in the plating unit 2. The programs may be recorded in a computer-readable recording medium 31, or may be installed from the recording medium 31 to the storage. The computer-readable recording medium 31 may be, by way non-limiting example, a hard disk (HD), a flexible disk (FD), a compact disk (CD), a magnet optical disk (MO), or a memory card. Stored in the recording medium 31 is a program which, when executed by a computer for controlling the operation of the plating apparatus 1, allows the computer to control the plating apparatus 1 to perform a plating method to be described later.

Referring to FIG. 1, a configuration of the plating unit 2 will be elaborated. FIG. 1 is a schematic plan view illustrating the configuration of the plating unit 2.

The plating unit 2 includes a carry-in/out station 21 and a processing station 22 which is provided adjacent to the carry-in/out station 21.

The carry-in/out station 21 is equipped with a placing section 211 and a transfer section 212 which is provided adjacent to the placing section 211.

In the placing section 211, transfer containers (hereinafter, referred to as "carriers C") for accommodating therein a plurality of substrates W horizontally are placed.

The transfer section 212 is equipped with a transfer device 213 and a delivery unit 214. The transfer device 213 is provided with a holding mechanism configured to hold a substrate W and is configured to be movable horizontally and vertically and pivotable around a vertical axis.

The processing station 22 includes plating devices 5. In the present exemplary embodiment, the number of the plating devices 5 belonging to the processing station 22 is two or more. However, only one plating device 5 may be provided. The plating devices 5 are arranged at both sides (both sides in a direction perpendicular to a moving direction of a transfer device 222 to be described below) of a transfer path 221 which extends in a preset direction.

The transfer device 222 is provided in the transfer path 221. The transfer device 222 is equipped with a holding mechanism configured to hold the substrate W and is configured to be movable horizontally and vertically and pivotable around a vertical axis.

In the plating unit 2, the transfer device 213 of the carry-in/out station 21 is configured to transfer the substrate W between the carrier C and the delivery unit 214. To elaborate, the transfer device 213 takes out the substrate W from the carrier C which is placed in the placing section 211, and places the substrate W in the delivery unit 214. Further, the transfer device 213 takes out the substrate W which is placed in the delivery unit 214 by the transfer device 222 of the processing station 22, and accommodates the substrate W back into the carrier C on the placing section 211.

In the plating unit 2, the transfer device 222 of the processing station 22 is configured to transfer the substrate W between the delivery unit 214 and the plating device 5 and between the plating device 5 and the delivery unit 214. To elaborate, the transfer device 222 takes out the substrate W which is placed in the delivery unit 214 and then carries the substrate W into the plating device 5. Further, the transfer device 222 takes out the substrate W from the plating device 5 and places the substrate W in the delivery unit 214.

Figure 2:
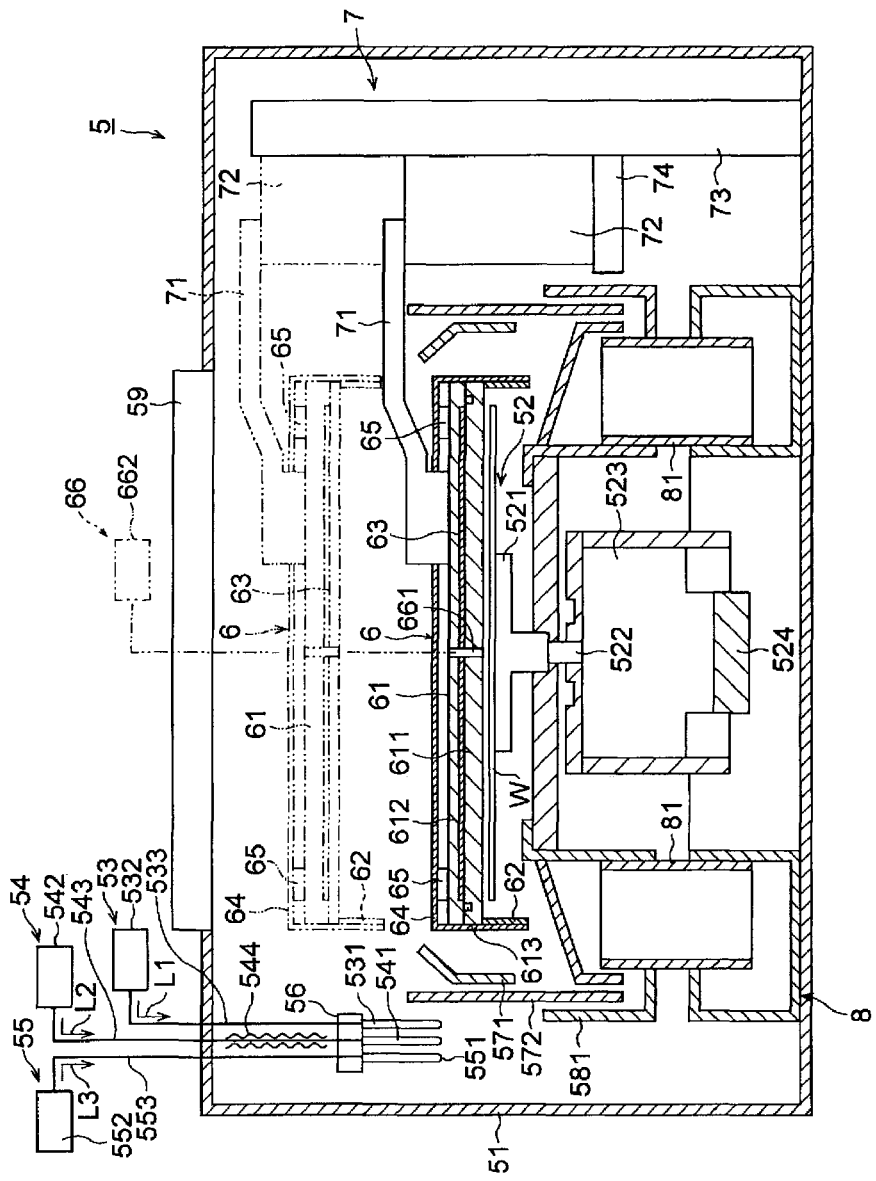
FIG. 2 is a cross sectional view illustrating a configuration of a plating device shown in FIG. 1.

Now, a configuration of the plating device 5 will be described with reference to FIG. 2. FIG. 2 is a schematic cross sectional view illustrating the configuration of the plating device 5.

The plating device 5 is configured to perform a liquid processing including an electroless plating processing. This plating device 5 includes a chamber 51; a substrate holder 52 disposed within the chamber 51 and configured to hold the substrate W horizontally; and a plating liquid supply 53 (processing liquid supply) configured to supply the plating liquid L1 (processing liquid) onto a top surface of the substrate W held by the substrate holder 52. In the present exemplary embodiment, the substrate holder 52 includes a chuck member 521 configured to vacuum-attract a bottom surface (rear surface) of the substrate W. This chuck member 521 is of a so-called vacuum chuck type. However, the substrate holder 52 may be of a so-called mechanical chuck type in which an edge portion of the substrate W is held by a chuck mechanism or the like.

The substrate holder 52 is connected with a rotation motor 523 (rotational driving unit) via a rotation shaft 522. If the rotation motor 523 is driven, the substrate holder 52 is rotated along with the substrate W. The rotation motor 523 is supported on a base 524 which is fixed to the chamber 51.

The plating liquid supply 53 is equipped with a plating liquid nozzle 531 (processing liquid nozzle) configured to discharge (supply) the plating liquid L1 onto the substrate W held by the substrate holder 52; and a plating liquid source 532 configured to supply the plating liquid L1 to the plating liquid nozzle 531. The plating liquid source 532 is configured to supply the plating liquid L1 heated to or regulated to a preset temperature to the plating liquid nozzle 531 via a plating liquid line 533. A temperature of the plating liquid L1 at the moment when it is discharged from the plating liquid nozzle 531 is in a range from, e.g., 55° C. to 75° C., more desirably, in a range from 60° C. to 70° C. The plating liquid nozzle 531 is held by a nozzle arm 56 and configured to be movable.

The plating liquid L1 is an autocatalytic (reduction) plating liquid for electroless plating. The plating liquid L1 contains a metal ion such as a cobalt (Co) ion, a nickel (Ni) ion, a tungsten (W) ion; a copper (Cu) ion, a palladium (Pd) ion, a gold (Au) ion or a ruthenium (Ru) ion, and a reducing agent such as hypophosphorous acid or dimethylaminoborane. The plating liquid L1 may further contain an additive or the like. A plating film 96 (a metal film, see FIG. 3B) formed by the plating processing with the plating liquid L1 may be, by way of non-limiting example, CoWB, CoB, CoWP, CoWBP, NiWB, NiB, NiWP, NiWBP, Cu, Pd, Ru, or the like. Further, the plating film 96 may be composed of a single layer or multiple layers. For example, when the plating film 96 has a double-layer structure, the plating film 96 may have layers of CoWB/CoB or Pd/CoB stacked in sequence from a base metal layer 93 (to be described later) side.

The plating device 5 according to the present exemplary embodiment is further equipped with a pre-cleaning liquid supply 54 configured to supply a pre-cleaning liquid L2 onto the top surface of the substrate W held by the substrate holder 52; and a rinse liquid supply 55 configured to supply a rinse liquid L3 onto the top surface of the substrate W.

The pre-cleaning liquid supply 54 is configured to supply the pre-cleaning liquid L2 onto the substrate W held and rotated by the substrate holder 52 to pre-clean the base metal layer 93 (to be described later) of the substrate W. This pre-cleaning liquid supply 54 is equipped with a pre-cleaning liquid nozzle 541 configured to discharge the pre-cleaning liquid L2 onto the substrate W held by the substrate holder 52; and a pre-cleaning liquid source 542 configured to supply the pre-cleaning liquid L2 to the pre-cleaning liquid nozzle 541. Here, the pre-cleaning liquid source 542 is configured to supply the pre-cleaning liquid L2 heated to or regulated to a preset temperature as will be described later to the pre-cleaning liquid nozzle 541 via a pre-cleaning liquid line 543. The pre-cleaning liquid nozzle 541 is held by the nozzle arm 56 and configured to be movable along with the plating liquid nozzle 531.

As an example of the pre-cleaning liquid L2, dicarboxylic acid or tricarboxylic acid may be used. As an example of the dicarboxylic acid, an organic acid such as a malic acid, a succinic acid, a malonic acid, an oxalic acid, a glutaric acid, an adipic acid, or a tartaric acid may be used. Further, as an example of the tricarboxylic acid, an organic acid such as a citric acid may be used.

In the present exemplary embodiment, the pre-cleaning liquid L2 is heated or temperature-controlled such that a temperature of the pre-cleaning liquid L2 at least on the substrate W is set to a temperature higher than a room temperature. To elaborate, the temperature of the pre-cleaning liquid L2 is set to be equal to or higher than 40° C., desirably, in a range from 50° C. to 80° C., and, more desirably, in a range from 60° C. to 70° C. In this way, by heating or regulating the pre-cleaning liquid L2 to equal to or higher than 40° C., reactivity of the pre-cleaning liquid L2 can be improved, and an oxide film or the like formed on the base metal layer 93 (to be described later) of the substrate W can be removed efficiently in a short time period.

The pre-cleaning liquid L2 is heated by a heating device 544 of the pre-cleaning liquid supply 54. In this case, the heating device 544 is a heat exchanger provided at the pre-cleaning liquid line 543 and is configured to heat the pre-cleaning liquid L2 flowing in the pre-cleaning liquid line 543. However, the heating device 544 is not limited thereto, and it may be provided in a tank of the pre-cleaning liquid source 542 and configured to heat the pre-cleaning liquid L2 stored in the tank. In this case, the temperature of the pre-cleaning liquid L2 at the moment when it is supplied onto the substrate W from the pre-cleaning liquid nozzle 541 may be set to be equal to or higher than 40° C. Alternatively, the pre-cleaning liquid L2 may be supplied onto the substrate W from the pre-cleaning liquid nozzle 541 in a room-temperature state and then heated by a heating device (for example, a heater 63 to be described later) provided near the substrate W so that the temperature of the pre-cleaning liquid L2 on the substrate W becomes equal to or higher than 40° C.

Moreover, it is desirable that the temperature of the pre-cleaning liquid L2 is close to the temperature of the plating liquid L1 to be used in a subsequent process. To be specific, it is desirable that the temperature of the pre-cleaning liquid L2 is set to be within ±5° C. of the temperature of the plating liquid L1. For example, if the temperature of the plating liquid L1 when it is discharged is in a range from 55° C. to 75° C., it is desirable that the temperature of the pre-cleaning liquid L2 is set to be in a range from 50° C. to 80° C. In this way, by setting the temperature of the pre-cleaning liquid L2 to be close to the temperature of the plating liquid L1, the substrate W can be pre-heated by the pre-cleaning liquid L2 before the plating processing is performed. Thus, the plating processing can be begun smoothly.

The rinse liquid supply 55 is equipped with a rinse liquid nozzle 551 configured to discharge the rinse liquid L3 onto the substrate W held by the substrate holder 52; and a rinse liquid source 552 configured to supply the rinse liquid L3 to the rinse liquid nozzle 551. The rinse liquid nozzle 551 is held by the nozzle arm 56 and configured to be movable along with the plating liquid nozzle 531 and the pre-cleaning liquid nozzle 541. Further, the rinse liquid source 552 is configured to supply the rinse liquid L3 to the rinse liquid nozzle 551 via a rinse liquid line 553. As an example of the rinse liquid L3, pure water or the like may be used.

A non-illustrated nozzle moving device is connected to the nozzle arm 56 which holds the plating liquid nozzle 531, the pre-cleaning liquid nozzle 541 and the rinse liquid nozzle 551 as described above. This nozzle moving device is configured to move the nozzle arm 56 horizontally and vertically. To be more specific, the nozzle arm 56 is configured to be moved between a discharge position where the processing liquid (the plating liquid L1, the pre-cleaning liquid L2 or the rinse liquid L3) is discharged onto the substrate W and a retreat position where the nozzle arm 56 is retreated from the discharge position by the nozzle moving device. Here, the discharge position is not particularly limited as long as the processing liquid can be supplied onto a certain position on the top surface of the substrate W. By way of example, it is desirable that the discharge position is set such that the processing liquid can be supplied onto the center of the substrate W. The discharge position of the nozzle arm 56 may be different when the plating liquid L1 is supplied onto the substrate W, when the pre-cleaning liquid L2 is supplied onto the substrate W, and when the rinse liquid L3 is supplied onto the substrate W. The retreat position is a position within the chamber 51 which is not overlapped with the substrate W when viewed from above and far from the discharge position. When the nozzle arm 56 is placed at the retreat position, interference between this nozzle arm 56 and a cover body 6 being moved can be avoided.

A cup 571 is disposed around the substrate holder 52. The cup 571 has a ring shape when viewed from above. The cup 571 receives the processing liquid scattered from the substrate W when the substrate W is rotated, and guides the received processing liquid to a drain duct 581. An atmosphere blocking cover 572 is provided around the cup 571 to suppress diffusion of an atmosphere around the substrate W into the chamber 51. This atmosphere blocking cover 572 has a cylindrical shape vertically extending with an open top. The cover body 6 to be described later is configured to be inserted into the atmosphere blocking cover 572 from above.

The substrate W held by the substrate holder 52 can be covered by the cover body 6. This cover body 6 includes a ceiling member 61 and a sidewall member 62 extending downwards from the ceiling member 61.

The ceiling member 61 includes a first ceiling plate 611 and a second ceiling plate 612 provided on the first ceiling plate 611. A heater 63 (heating device) is disposed between the first ceiling plate 611 and the second ceiling plate 612. The first ceiling plate 611 and the second ceiling plate 612 are configured to seal the heater 63 lest the heater 63 should come into contact with the processing liquid such as the plating liquid L1. To be more specific, a seal ring 613 is disposed around the heater 63 between the first ceiling plate 611 and the second ceiling plate 612, and the heater 63 is sealed by this seal ring 613. Desirably, the first ceiling plate 611 and the second ceiling plate 612 have corrosion resistance against the processing liquid such as the plating liquid L1, and may be made of, by way of non-limiting example, an aluminium alloy. Further, to improve the corrosion resistance, the first ceiling plate 611, the second ceiling plate 612 and the sidewall member 62 may be coated with Teflon (registered trademark).

The cover body 6 is connected with a cover body moving device 7 via a cover arm 71. The cover body moving device 7 is configured to move the cover body 6 horizontally and vertically. To be more specific, the cover body moving device 7 includes a rotating motor 72 configured to move the cover body 6 horizontally and a cylinder 73 (distance adjuster) configured to move the cover body 6 vertically. The rotating motor 72 is mounted on a supporting plate 74 configured to be movable vertically with respect to the cylinder 73. As an alternative to the cylinder 73, an actuator (not shown) including a motor and a ball screw may be used.

The rotating motor 72 of the cover body moving device 7 is configured to move the cover body 6 between an upper position above the substrate W held by the substrate holder 52 and a retreat position retreated from the upper position. Here, the upper position is a position facing the substrate W held by the substrate holder 52 with a relatively large gap therebetween and overlapped with the substrate W when viewed from above. The retreat position is a position within the chamber 51 which is not overlapped with the substrate W when viewed from above. When the cover body 6 is located at the retreat position, interference between the nozzle arm 56 being moved and the cover body 6 is avoided. A rotational axis of the rotating motor 72 extends vertically, and the cover body 6 is configured to be rotatable horizontally between the upper position and the retreat position.

The cylinder 73 of the cover body moving device 7 is configured to move the cover body 6 vertically to thereby adjust a distance between the substrate W on which the plating liquid L1 has been supplied and the first ceiling plate 611 of the ceiling member 61. To be more specific, the cylinder 73 locates the cover body 6 at a lower position (a position indicated by a solid line in FIG. 2) or the upper position (a position indicated by a dashed double-dotted line in FIG. 2).

An inert gas (for example, a nitrogen ($N_2$) gas) is supplied to an inside of the cover body 6 by an inert gas supply 66. The inert gas supply 66 is equipped with a gas nozzle 661 configured to discharge the inert gas to the inside of the cover body 6; and an inert gas source 662 configured to supply the inert gas to the gas nozzle 661. The gas nozzle 661 is provided at the ceiling member 61 of the cover body 6 and is configured to discharge the inert gas toward the substrate W in the state that the cover body 6 covers the substrate W.

The ceiling member 61 and the sidewall member 62 of the cover body 6 are covered by a cover lid 64. This cover lid 64 is disposed on the second ceiling plate 612 of the cover body 6 with supporting members 65 therebetween. That is, the second ceiling plate 612 is provided with the multiple supporting members 65 protruding upwards from a top surface of the second ceiling plate 612, and the cover lid 64 is placed on the supporting members 65. The cover lid 64 is configured to be moved horizontally and vertically along with the cover body 6. Further, it is desirable that the cover lid 64 has insulation property higher than those of the ceiling member 61 and the sidewall member 62 to suppress a leak of heat within the cover body 6 to the vicinity thereof. By way of example, the cover lid 64 is desirably made of a resin material, and, more desirably, the resin material has heat resistance.

A fan filter unit 59 (gas supply) is provided at an upper portion of the chamber 51 to supply clean air (gas) to the vicinity of the cover body 6. The fan filter unit 59 is configured to supply the air into the chamber 51 (particularly, into the atmosphere blocking cover 572), and the supplied air flows toward an exhaust line 81. A downflow of the air flowing downwards is formed around the cover body 6, and a gas vaporized from the processing liquid such as the plating liquid L1 flows toward the exhaust line 81 by being carried by this downflow. Accordingly, a rise of the gas vaporized from the processing liquid and diffusion of this gas into the chamber 51 are suppressed.

The gas supplied from the above-described fan filter unit 59 is exhausted by an exhaust device 8.

Figure 3A:
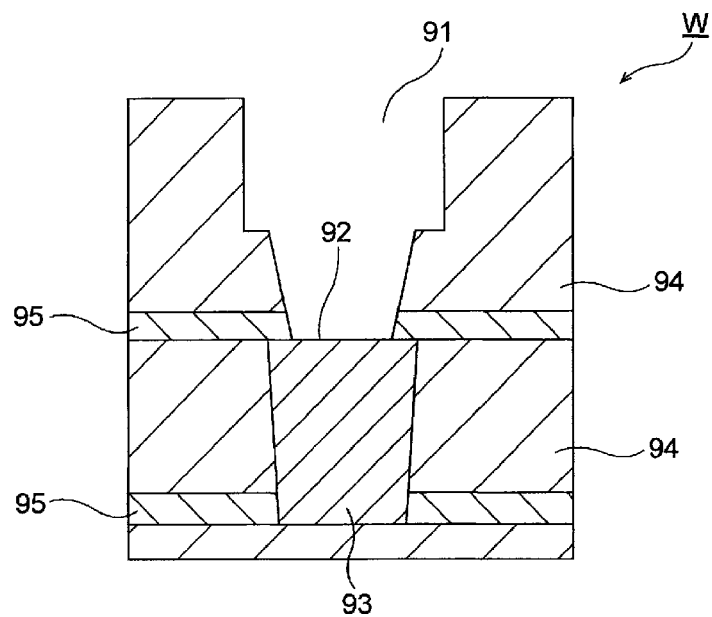
FIG. 3A and FIG. 3B are schematic cross sectional views partially illustrating a structure of a substrate.

Now, the substrate W to be subjected to the plating processing by using the plating apparatus 1 will be explained with reference to FIG. 3A. FIG. 3A is a schematic cross sectional view partially illustrating the substrate W before being subjected to the plating processing.

As depicted in FIG. 3A, the substrate W is provided with a recess 91 and has a structure in which the base metal layer 93 is exposed from a bottom surface 92 of the recess 91. To elaborate, the substrate W has an interlayer insulating film 94, the base metal layer 93 buried in the interlayer insulating film 94 and the recess 91 previously formed in the interlayer insulating film 94. The interlayer insulating film 94 is formed of a low dielectric film such as, but not limited to, a SiCOH film, a $SiO_2$ film, a SiN film, or a SiOC film. Further, the recess 91 is previously formed through a dry etching process by using, for example, a photolithography technique.

Further, a barrier film 95 is formed around the base metal layer 93. As an example, silicon, SiCN, SiC (silicon carbide), SiN (silicon nitride) or the like is used as the barrier film 95.

The base metal layer 93 is made of a metal layer such as, by way of example, but not limitation, copper (Cu), cobalt (Co), tungsten (W), ruthenium (Ru), or the like. A top surface of the base metal layer 93 is exposed from the bottom surface 92 of the recess 91. In this case, the exposed top surface of the base metal layer 93 may be damaged by the dry etching process or the like, or an oxide film of a metal (for example, a copper oxide film) may be formed on this top surface of the base metal layer 93. Thus, the top surface of the base metal layer 93 is cleaned by the pre-cleaning liquid L2 so that the oxide film or the like is removed, as will be described later.

Figure 4:
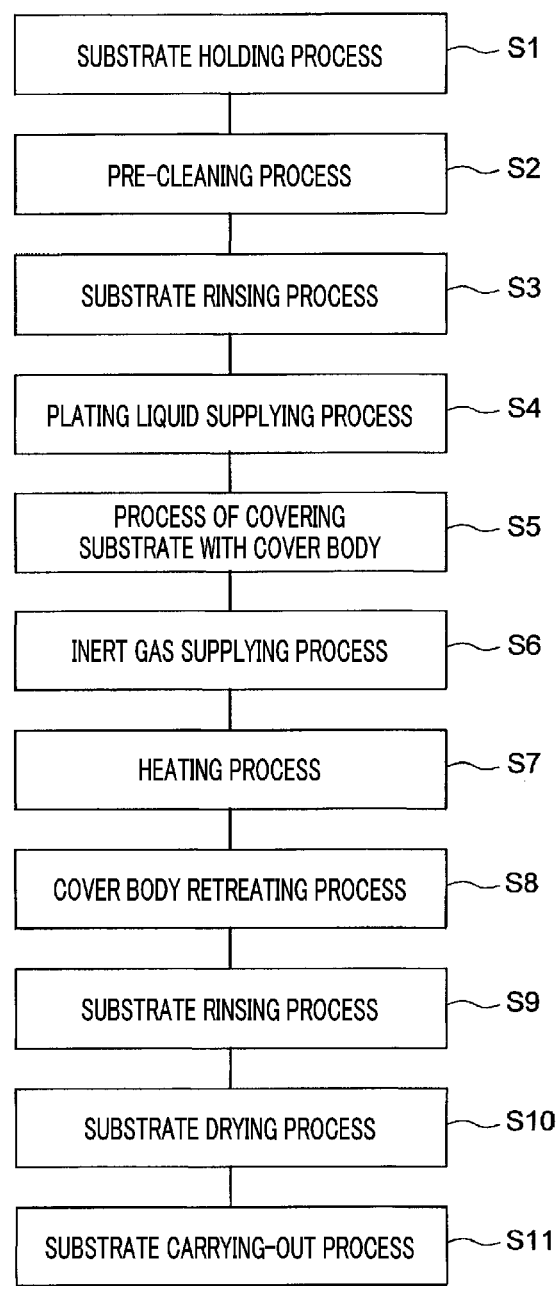
FIG. 4 is a flowchart illustrating a plating processing for the substrate in the plating apparatus of FIG. 1.

Now, an operation of the present exemplary embodiment having the above-described configuration will be explained with reference to FIG. 4. Here, the plating method using the plating apparatus 1 will be described as an example of a substrate liquid processing method.

The plating method performed by the plating apparatus 1 includes a plating processing upon the above-described substrate W. The plating processing is performed by the plating device 5. An operation of the plating device 5 to be described below is controlled by the controller 3. Further, while the following processing is being performed, the clean air is supplied into the chamber 51 from the fan filter unit 59 and flows toward the exhaust line 81.

Substrate Holding Process

First, the substrate W is carried into the plating device 5 and is held by the substrate holder 52 (process S1). Here, the bottom surface of the substrate W is vacuum-attracted, so that the substrate W is horizontally held by the substrate holder 52.

Pre-Cleaning Process

Then, the substrate W horizontally held by the substrate holder 52 is pre-cleaned (process S2). In this case, the rotation motor 523 is driven to rotate the substrate W at a predetermined rotation number. Subsequently, the nozzle arm 56 placed at the retreat position is moved to the discharge position. Then, the pre-cleaning liquid L2 is supplied onto the substrate W being rotated from the pre-cleaning liquid nozzle 541, so that the front surface of the substrate W is cleaned. Accordingly, the oxide film formed on the base metal layer 93 or the deposit thereon is removed from the substrate W. The pre-cleaning liquid L2 supplied onto the substrate W is drained into the drain duct 581.

Here, the pre-cleaning liquid L2 on the substrate W is heated or regulated, by the heating device 544 of the pre-cleaning liquid supply 54, to a temperature equal to or higher than 40° C., desirably, a temperature in a range from 50° C. to 80° C., more desirably, a temperature in a range from 60° C. to 70° C. In this way, by heating or regulating the pre-cleaning liquid L2 to the aforementioned temperature, the reactivity of the pre-cleaning liquid L2 is improved, so that the oxide film or the like formed on the base metal layer 93 of the substrate W can be removed efficiently in a short time period. Specifically, if the pre-cleaning liquid L2 heated to about 60° C. is used, the processing time of the pre-cleaning processing can be shortened to about 1 minute from 5 minutes which is taken in a comparative example where the pre-cleaning liquid L2 having the room temperature is used.

Substrate Rinsing Process

Subsequently, the pre-cleaned substrate W is rinsed (process S3). In this case, the rinse liquid L3 is supplied from the rinse liquid nozzle 551 onto the substrate W being rotated, so that the front surface of the substrate W is rinsed. Accordingly, the pre-cleaning liquid L2 left on the substrate W is washed away. The rinse liquid L3 supplied onto the substrate W is drained into the drain duct 581.

Plating Liquid Supplying Process

Thereafter, as a plating liquid supplying process, the plating liquid L1 is supplied onto and accumulated on the rinsed substrate W (process S4). In this case, the rotation number of the substrate W is first reduced to be smaller than a rotation number in the substrate rinsing process. By way of example, the rotation number of the substrate W may be set to be 50 rpm to 150 rpm. Accordingly, the plating film 96 formed on the substrate W as will be described later can be uniformed. Further, the rotation of the substrate W may be stopped to increase an accumulation amount of the plating liquid L1.

Next, the plating liquid L1 is discharged onto the top surface of the substrate W from the plating liquid nozzle 531. The discharged plating liquid L1 stays on the top surface of the substrate W due to a surface tension to be accumulated on the top surface of the substrate W, so that a layer (a so-called puddle) of the plating liquid L1 is formed. A part of the plating liquid L1 is flown from the top surface of the substrate W to be drained from the drain duct 581. After a preset amount of the plating liquid L1 is discharged from the plating liquid nozzle 531, the discharge of the plating liquid L1 is stopped. Then, the nozzle arm 56 placed at the discharge position is moved to the retreat position.

Plating Liquid Heating Process

Subsequently, as a plating liquid heating process, the plating liquid L1 accumulated on the substrate W is heated. This plating liquid heating process includes a process of covering the substrate W with the cover body 6 (process S5), a process of supplying the inert gas (process S6) and a process of heating the plating liquid L1 (process S7). Further, it is desirable that the rotation number of the substrate W in the plating liquid heating process is maintained equal to the rotation number in the plating liquid supplying process (or it is desirable that the rotation of the substrate W is stopped).

Process of Covering Substrate with Cover Body

First, the substrate W is covered by the cover body 6 (process S5). In this case, the rotating motor 72 of the cover body moving device 7 is first driven, so that the cover body 6 placed at the retreat position is rotated horizontally to be placed at the upper position. Then, the cylinder 73 of the cover body moving device 7 is driven to lower the cover body 6 placed at the upper position. Accordingly, the substrate W is covered by the cover body 6, so that a space around the substrate W is closed.

Inert Gas Supplying Process

After the substrate W is covered by the cover body 6, the gas nozzle 661 provided at the ceiling member 61 of the cover body 6 discharges the inert gas to the inside of the cover body 6 (process S6). Accordingly, the inside of the cover body 6 is replaced by the inert gas, so that the space around the substrate W is turned into a low-oxygen atmosphere. The inert gas is discharged for a predetermined time, and upon the lapse of this predetermined time, the discharge of the inert gas is stopped.

Heating Process

Then, the plating liquid L1 accumulated on the substrate W is heated (process S7). In the heating process, the heater 63 is driven, so that the plating liquid L1 accumulated on the substrate W is heated. The heating of the plating liquid L1 in the heating process is carried out for a preset time period which is set to increase the temperature of the plating liquid L1 to the preset temperature. If the temperature of the plating liquid L1 is raised up to a temperature where a component of the plating liquid L1 is precipitated, the component of the plating liquid L1 is precipitated on the top surface of the substrate W, and the formation of the plating film 96 is begun.

Cover Body Retreating Process

Upon the completion of the heating process, the cover body moving device 7 is driven to locate the cover body 6 at the retreat position (process S8). First, the cylinder 73 of the cover body moving device 7 is first driven to raise and locate the cover body 6 at the upper position. Then, the rotating motor 72 of the cover body moving device 7 is driven to rotate the cover body 6 at the upper position horizontally, so that the cover body 6 is placed at the retreat position.

Through these operations, the plating liquid heating process (the processes S5 to S8) for the substrate W is completed.

Substrate Rinsing Process

Thereafter, the substrate W after being subjected to the plating liquid heating process is rinsed (process S9). First, the rotation number of the substrate W is increased to be higher than the rotation number in the plating processing. By way of example, the substrate W is rotated at the same rotation number as in the substrate rinsing process (process S3) before the plating processing. Then, the rinse liquid nozzle 551 placed at the retreat position is moved to the discharge position. Thereafter, the rinse liquid L3 is supplied from the rinse liquid nozzle 551 onto the substrate W being rotated, so that the front surface of the substrate W is rinsed. As a result, the plating liquid L1 remaining on the substrate W is washed away.

Substrate Drying Process

Figure 3B:
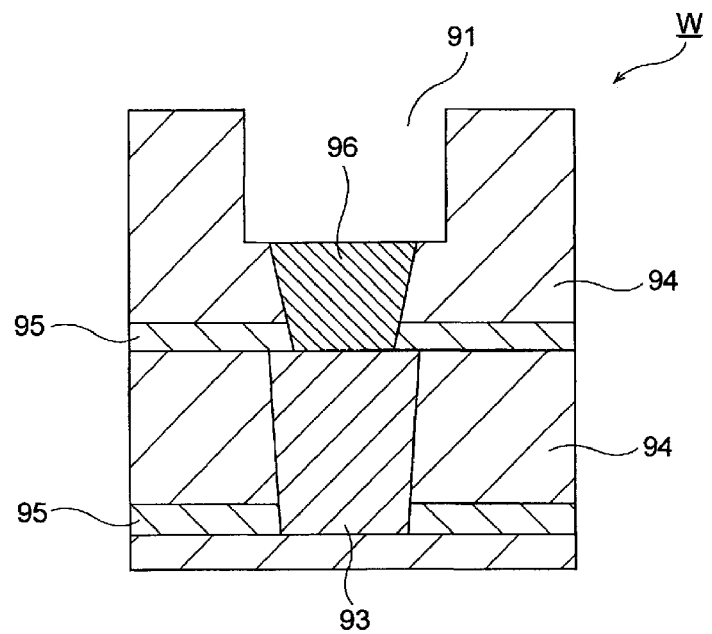

Afterwards, the rinsed substrate W is dried (process S10). In this case, the rotation number of the substrate W, for example, is increased to be higher than the rotation number in the substrate rinsing process (process S9), so that the substrate W is rotated at a high speed. Accordingly, the rinse liquid L3 left on the substrate W is removed by being scattered, and the substrate W having the plating film 96 formed on the base metal layer 93 within the recess 91 as shown in FIG. 3B is obtained. In this case, the drying of the substrate W may be accelerated by jetting an inert gas such as a nitrogen ($N_2$) gas to the substrate W. Further, in the substrate rinsing process (process S10), a processing liquid composed of an organic solvent such as IPA (isopropyl alcohol) may be supplied onto the substrate W. At this time, the rinse liquid L3 remaining on the substrate W may be mixed in the processing liquid such as the IPA, and the substrate W may be dried as this processing liquid is scattered off the top surface of the substrate W.

Substrate Carrying-Out Process

Thereafter, the substrate W is separated from the substrate holder 52 and carried out from the plating device 5 (process S11).

Through the above-described operations, the series of processes S1 to S11 of the plating method for the substrate W using the plating apparatus 1 are completed.

According to the present exemplary embodiment as described above, when the pre-cleaning processing is performed on the base metal layer 93 by the pre-cleaning liquid supply 54, the temperature of the pre-cleaning liquid L2 on the substrate W is set to be equal to or higher than 40° C., desirably, equal to or higher than 60° C. and equal to or lower than 70° C. Accordingly, the reactivity and the cleaning effect of the pre-cleaning liquid L2 are improved due to the temperature rise, so that a portion of the top surface of the base metal layer 93 damaged by the dry etching or the oxide film formed on the base metal layer 93 can be removed efficiently in the short period of time. As a result, the processing time of the pre-cleaning process can be shortened, so that the processing efficiency for the substrate W can be improved.

Modification Examples

Now, various modification examples of the present exemplary embodiment will be discussed. Further, in the various drawings illustrating the following modification examples, the same parts as those described in the above exemplary embodiment will be assigned same reference numerals. The following description will focus on distinctive features from the above-described exemplary embodiment, and detailed description on the common features will be omitted.

Modification Example 1

Figure 5:
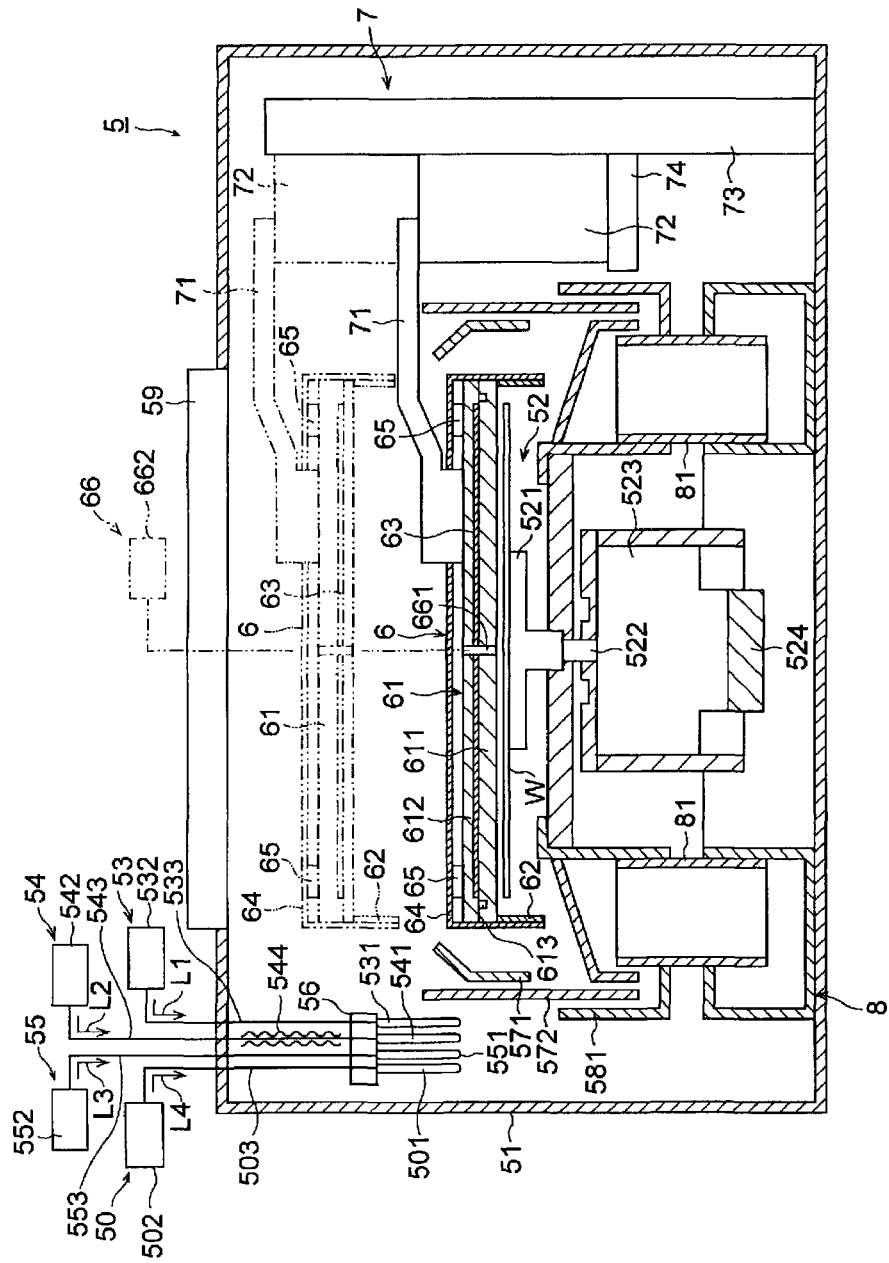
FIG. 5 is a cross sectional view illustrating a configuration of a plating device according to one modification example (modification example 1).
Figure 6:
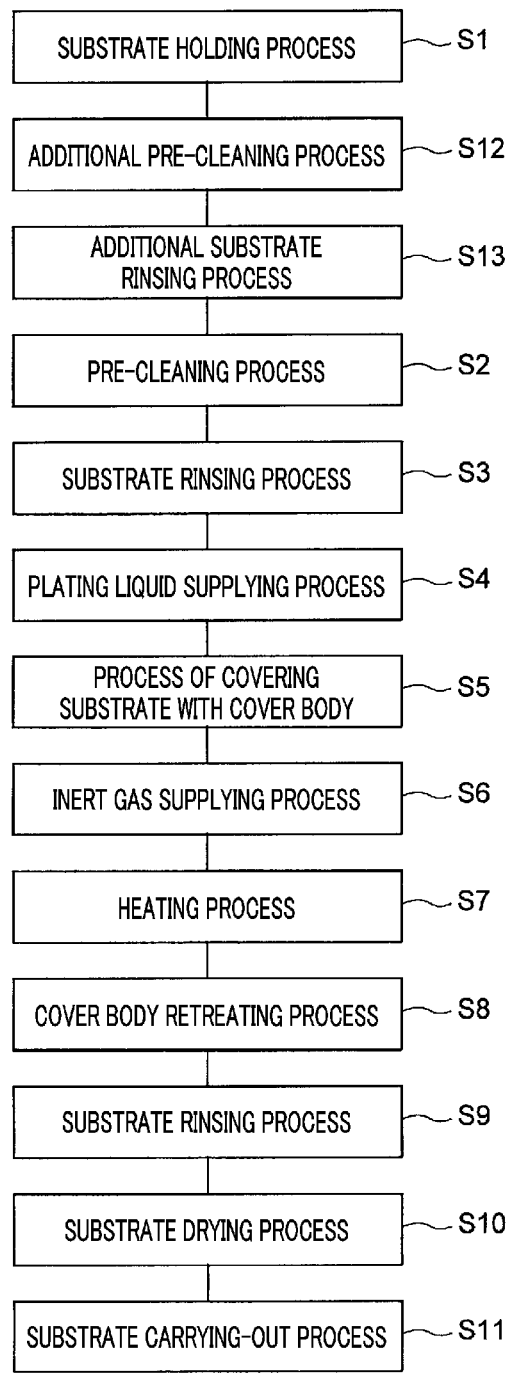
FIG. 6 is a flowchart illustrating a plating processing for the substrate according to the modification example (modification example 1).

FIG. 5 and FIG. 6 are diagrams illustrating one modification example (modification example 1) of the exemplary embodiment. As depicted in FIG. 5, the plating device 5 is equipped with an additional pre-cleaning liquid supply 50 configured to supply an additional pre-cleaning liquid L4 onto the top surface of the substrate W. This additional pre-cleaning liquid supply 50 is configured to supply the additional pre-cleaning liquid L4 onto the substrate W before being subjected to the pre-cleaning processing, for the purpose of accelerating oxidation of the base metal layer 93 of the substrate W. This additional pre-cleaning liquid supply 50 includes an additional pre-cleaning liquid nozzle 501 configured to discharge the additional pre-cleaning liquid L4 onto the substrate W held by the substrate holder 52; and an additional pre-cleaning liquid source 502 configured to supply the additional pre-cleaning liquid L4 to the additional pre-cleaning liquid nozzle 501. The additional pre-cleaning liquid source 502 is configured to supply the additional pre-cleaning liquid L4 to the additional pre-cleaning liquid nozzle 501 via an additional pre-cleaning liquid line 503. The additional pre-cleaning liquid nozzle 501 is held by the nozzle arm 56 and configured to be moved along with the plating liquid nozzle 531, the pre-cleaning liquid nozzle 541 and the rinse liquid nozzle 551. As an example of the additional pre-cleaning liquid L4, a cleaning liquid enabling surface layer oxidation, that is, capable of oxidizing a modified (damaged) layer of the metal on the base metal layer 93 to thereby allow the modified layer to be easily removed by the pre-cleaning liquid L2 may be used. By way of non-limiting example, an alkaline cleaning liquid may be used.

In this case, as shown in FIG. 6, an additional pre-cleaning process (process S12) and an additional substrate rinsing process (process S13) are performed prior to the pre-cleaning process (process S2).

The additional pre-cleaning process (process S12) is a process of supplying the additional pre-cleaning liquid L4 onto the substrate W to accelerate the oxidation of the modified layer formed on the base metal layer 93. In this additional pre-cleaning process (process S12), the additional pre-cleaning liquid L4 is supplied from the additional pre-cleaning liquid nozzle 501 onto the substrate W being held and rotated by the substrate holder 52, so that the front surface of the substrate W is pre-cleaned additionally. Accordingly, the oxidation of the modified layer formed on the base metal layer 93 is accelerated, and the substantially entire modified layer is oxidized. As a consequence, the oxide film of the metal can be easily removed in the subsequent pre-cleaning process (process S2).

Thereafter, in the additional substrate rinsing process (process S13), the additionally pre-cleaned substrate W is rinsed by discharging the rinse liquid L3 onto the substrate W. To elaborate, the rinse liquid L3 is supplied from the rinse liquid nozzle 551 onto the substrate W being rotated, so that the front surface of the substrate W is rinsed. Accordingly, the additional pre-cleaning liquid L4 remaining on the substrate W is washed away.

Modification Example 2

Figure 7:
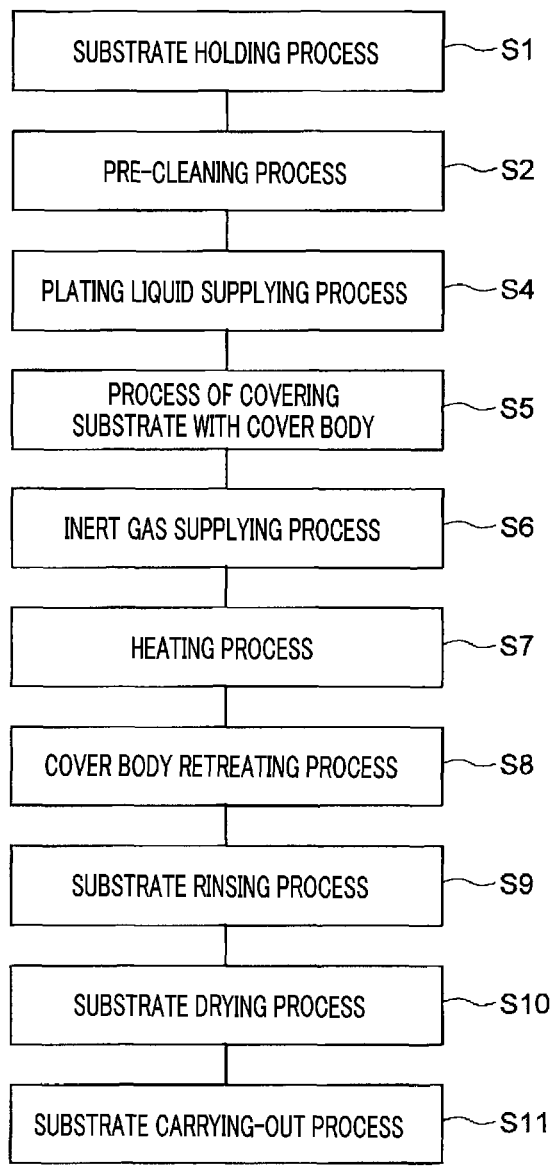
FIG. 7 is a flowchart illustrating a plating processing for the substrate according to another modification example (modification example 2).

FIG. 7 is a diagram illustrating another modification example (modification example 2) of the present exemplary embodiment. The above exemplary embodiment has been described for the case where the process of rinsing the substrate W (process S3) is performed after the process of pre-cleaning the substrate W (process S2) and before the process of supplying the plating liquid L1 (process S4). As shown in FIG. 7, however, the process of supplying the plating liquid L1 (process S4) may be performed after the pre-cleaning process (process S2) without performing the process of rinsing the substrate W (process S3) in between. That is, in the plating liquid supplying process (process S4), the plating liquid L1 is supplied onto the pre-cleaned substrate W. Accordingly, the base metal layer 93 free of the oxide film through the pre-cleaning processing can be suppressed from being re-oxidized by an oxygen mixed in the rinse liquid L3. Furthermore, in the case of performing the aforementioned additional pre-cleaning processing (modification example 1, FIG. 5 and FIG. 6) as well, the process of rinsing the substrate W (process S3) may not be performed.

Modification Example 3

Figure 8:
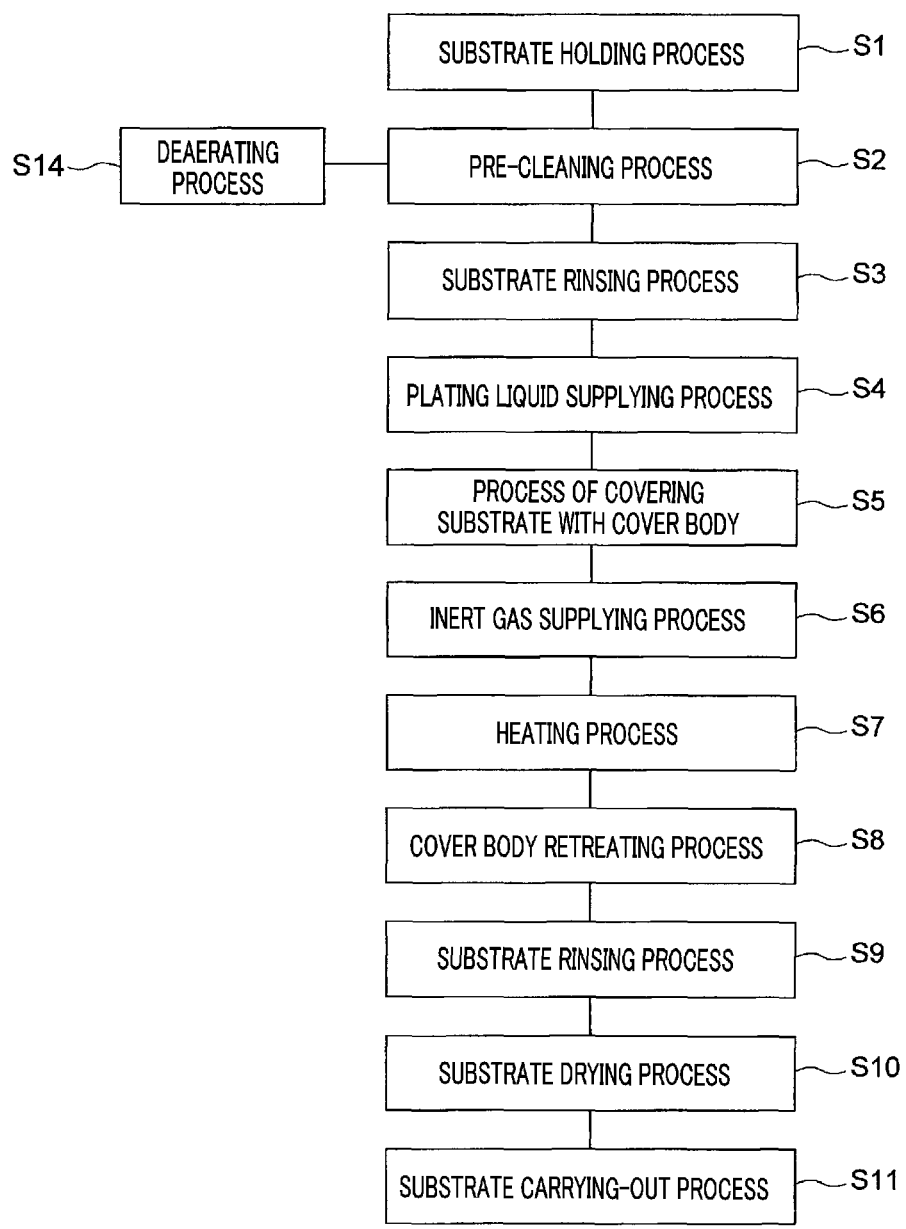
FIG. 8 is a flowchart illustrating a plating processing for the substrate according to a still another modification example (modification example 3).
Figure 9:
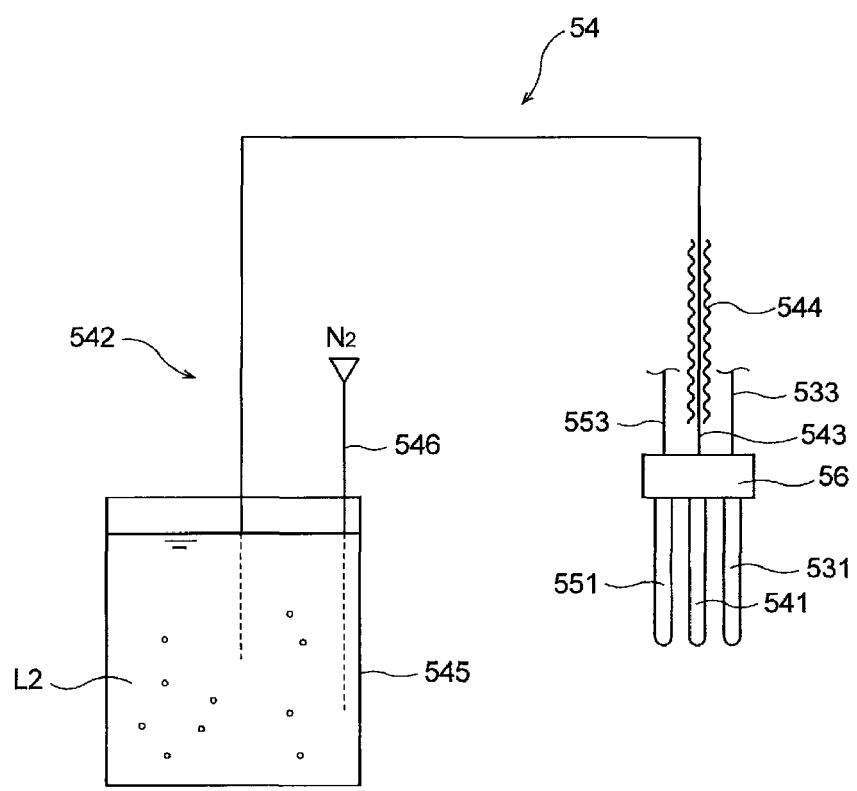
FIG. 9 is a schematic diagram illustrating a pre-cleaning liquid supply according to the still another modification example (modification example 3).

FIG. 8 and FIG. 9 are diagrams illustrating still another modification example (modification example 3) of the present exemplary embodiment. A plating method (modification example 3) shown in FIG. 8 includes a process of deaerating the pre-cleaning liquid L2 before being supplied onto the substrate W (process S14). In this case, as shown in FIG. 9, the pre-cleaning liquid source 542 of the pre-cleaning liquid supply 54 has a supply tank 545 which stores the pre-cleaning liquid L2 therein. Further, a deaerating device 546 configured to deaerate the pre-cleaning liquid L2 before being supplied onto the substrate W is connected to the supply tank 545. The deaerating device 546 is configured to supply an inert gas such as, but not limited to, nitrogen into the supply tank 545 and thus remove a dissolved oxygen and a dissolved hydrogen in the pre-cleaning liquid L2 stored in the supply tank 545. In this case, by allowing the inert gas such as the nitrogen to be dissolved in the pre-cleaning liquid L2, other gases such as the oxygen and the hydrogen already dissolved in the pre-cleaning liquid L2 can be discharged from the pre-cleaning liquid L2. The oxygen and the hydrogen discharged from the pre-cleaning liquid L2 is exhausted from the supply tank 545. In this way, by deaerating the pre-cleaning liquid L2, the base metal layer 93 can be suppressed from being oxidized by the dissolved oxygen in the pre-cleaning liquid L2. Furthermore, in this case, the process of the rinsing the substrate W (process S3) may not be provided, the same as in the modification example 2.

The various exemplary embodiments and modification examples are not limiting and can be modified in various ways without departing from the technical conception and essence of the present disclosure. Further, the constituent components described in the above exemplary embodiments and modification examples may be combined appropriately to produce various other embodiments. Some of the constituent components described in the various exemplary embodiments and modification examples may be deleted in various ways. Further, the constituent components in the different exemplary embodiments and modification examples may be appropriately combined.

According to the exemplary embodiment, it is possible to carry out a pre-cleaning processing in a short time period by improving processing performance of a pre-cleaning process.

We claim:

1. A substrate liquid processing method, comprising:
    horizontally holding and rotating a substrate which has a recess and a base metal layer exposed from a bottom surface of the recess;
    supplying a first pre-cleaning liquid onto the substrate to accelerate oxidation of the base metal layer, the first pre-cleaning liquid being an alkaline cleaning liquid; and
    after the supplying of the first pre-cleaning liquid, pre-cleaning the base metal layer by supplying a second pre-cleaning liquid onto the substrate being rotated, the second pre-cleaning liquid being dicarboxylic acid or tricarboxylic acid,
    wherein a temperature of the second pre-cleaning liquid on the substrate is equal to or higher than 40° C.

2. The substrate liquid processing method of claim 1, further comprising:
    supplying a plating liquid onto the pre-cleaned substrate.

3. The substrate liquid processing method of claim 2, wherein the temperature of the second pre-cleaning liquid is within ±5° C. of a temperature of the plating liquid.

4. The substrate liquid processing method of claim 2, wherein the supplying of the plating liquid is performed after the second pre-cleaning liquid of the base metal layer without rinsing the substrate in between.

5. The substrate liquid processing method of claim 1, wherein the temperature of the second pre-cleaning liquid is in a range from 60° C. to 70° C.

6. The substrate liquid processing method of claim 1, further comprising:
    deaerating the second pre-cleaning liquid before being supplied onto the substrate.

7. A non-transitory computer-readable recording medium having stored thereon computer-executable instructions that, in response to execution, cause a substrate liquid processing apparatus to perform a substrate liquid processing method as claimed in claim 1.

* * * * *